(12) United States Patent
Zehavi et al.

(10) Patent No.: US 7,108,746 B2
(45) Date of Patent: Sep. 19, 2006

(54) SILICON FIXTURE WITH ROUGHENED SURFACE SUPPORTING WAFERS IN CHEMICAL VAPOR DEPOSITION

(75) Inventors: Ranaan Y. Zehavi, Sunnyvale, CA (US); James E. Boyle, Saratoga, CA (US)

(73) Assignee: Integrated Materials, Inc., Sunnyvale, CA (US)

( * ) Notice: Subject to any disclaimer, the term of this patent is extended or adjusted under 35 U.S.C. 154(b) by 755 days.

(21) Appl. No.: 09/860,392

(22) Filed: May 18, 2001

(65) Prior Publication Data

US 2002/0170486 A1    Nov. 21, 2002

(51) Int. Cl.
*C30B 25/00*    (2006.01)

(52) U.S. Cl. .............................. 117/84; 117/88; 117/90

(58) Field of Classification Search ................... 117/84, 117/88, 90; 414/935; 118/500
See application file for complete search history.

(56) References Cited

U.S. PATENT DOCUMENTS

| 4,020,791 | A |   | 5/1977  | Reuschel et al. ............. 118/49  |
|-----------|---|---|---------|--------------------------------------|
| 4,123,989 | A |   | 11/1978 | Jewett ......................... 118/49 |
| 4,330,358 | A |   | 5/1982  | Grabmaier et al. .......... 156/603 |
| 4,357,201 | A |   | 11/1982 | Grabmaier et al. .......... 156/603 |
| 4,440,728 | A |   | 4/1984  | Stormont et al. ............ 422/246 |
| 5,098,675 | A |   | 3/1992  | Matsuo et al. .............. 422/249 |
| 5,102,494 | A |   | 4/1992  | Harvey et al. .............. 156/609 |
| 5,573,964 | A | * | 11/1996 | Hsu et al. .................... 438/158 |
| 5,578,132 | A | * | 11/1996 | Yamaga et al. .............. 118/724 |
| 6,056,123 | A | * | 5/2000  | Niemirowski et al. ....... 206/711 |
| 6,196,211 | B1|   | 3/2001  | Zehavi et al. ................ 125/12 |
| 6,205,993 | B1|   | 3/2001  | Zehavi et al. ............. 125/13.01 |
| 6,225,594 | B1|   | 5/2001  | Zehavi .................... 219/121.64 |
| 6,355,577 | B1| * | 3/2002  | Reder et al. ................ 438/758 |
| 6,425,168 | B1| * | 7/2002  | Takaku ....................... 29/25.01 |
| 6,455,395 | B1| * | 9/2002  | Boyle et al. ................ 438/455 |

FOREIGN PATENT DOCUMENTS

| EP | 0 713 245    |   | 11/1995 |
|----|--------------|---|---------|
| EP | 0713245 A2   | * | 11/1995 |
| EP | 10321543     |   | 5/1997  |
| EP | 1 049 133    |   | 4/2000  |
| JP | 52094070 A   | * | 8/1977  |
| JP | 05175319 A   | * | 7/1993  |
| JP | 10321543 A   | * | 12/1998 |

OTHER PUBLICATIONS

Patent Abstracts of Japan. English abstract of JP 05-175319 (1993).*
Derwent. English Abstract of JP 52-094070 A (1977).*
English Translation of JP 10-321543A (1998).*

* cited by examiner

*Primary Examiner*—Yogendra N. Gupta
*Assistant Examiner*—Matt Song
(74) *Attorney, Agent, or Firm*—Charles S. Guenzer

(57) ABSTRACT

A silicon-based wafer support tower particularly useful for batch-mode thermal chemical vapor deposition. The surfaces of the silicon tower are bead blasted to introduce sub-surface damage, which produces pits and cracks in the surface, which anchor subsequently deposited layer of, for example, silicon nitride, thereby inhibiting peeling of the nitride film. The surface roughness may be in the range of 250 to 2500 μm. Wafer support portions of the tower are preferably composed of virgin polysilicon. The invention can be applied to other silicon parts in a deposition or other substrate processing reactor, such as tubular sleeves and reactor walls. Tubular silicon members are advantageously formed by extrusion from a silicon melt.

28 Claims, 4 Drawing Sheets

ADDED PARTICLES

RUNS

US 7,108,746 B2

SILICON FIXTURE WITH ROUGHENED SURFACE SUPPORTING WAFERS IN CHEMICAL VAPOR DEPOSITION

BACKGROUND OF THE INVENTION

1. Field of the Invention

The invention relates generally to semiconductor processing. In particular, the invention relates to wafer support fixtures used in batch-mode chemical vapor deposition.

2. Background Art

The fabrication of silicon integrated circuits typically involves one or more steps of chemical vapor deposition (CVD). Many advanced deposition processes use plasma enchanced CVD to activate the chemical reaction resulting in the deposition of the film from a precursor gas. The plasma process allows low temperature deposition. On the other hand, thermal CVD is performed at elevated temperatures to thermally activate the chemical reaction resulting in the deposition of the film from a precursor gas. The temperatures associated with thermal CVD tend to be much higher than those for plasma enhanced CVD, but thermal CVD temperatures fall within a wide range depending upon the material being deposited and the precursor gas.

Thermal CVD is typically utilized for the deposition of silicon nitride and polysilicon. The silicon nitride is used, for example, for etch stop layers and anti-reflective coatings. Silicon nitride has a nominal composition of $Si_3N_4$, but some compositional variation is expected, such as $SiN_x$, where x ranges between 1.0 and 1.5. Polysilicon is polycrystalline silicon. It is used for anti-reflective coating and, when doped, for interconnects and electrodes.

Despite the trend to single-wafer processing chambers, batch processing for thermal CVD continues to be widely practiced because of its high throughput and the relatively low cost of equipment. Furthermore, thermal CVD can produce highly uniform films in batch processing. In batch CVD processing, a large number of silicon wafers are loaded onto a support fixture that is placed into a thermal CVD reactor. Typically, the support fixture is a tower in which the multiple wafers are supported horizontally and spaced vertically apart. Some applications continue to use boats as support fixture in which the multiple wafers are supported substantially vertically and spaced horizontally apart.

In the case of the deposition of silicon nitride, the precursor gas is typically composed of silane or a chlorosilane and a nitrogen source such ammonia. At elevated temperatures, typically in the range of 600 to 800° C. but sometimes extending down to 400° C. or even lower, the precursors react near the surface of the wafer to deposit silicon nitride on the wafer surface. In the case of chlorosilane and ammonia precursors, the reaction products are $Si_3N_4$ and $NH_4Cl$. The former deposits on the wafer while the latter is volatile and is evacuated from the furnace. However, thermal CVD tends to coat all surfaces exposed in the furnace. In particular, the support tower is typically coated with as much silicon nitride as is the wafer.

Quartz has in the past been the most prevalently used material for support towers used in a thermal CVD process. Quartz has a chemical composition of amorphous silicon dioxide, which is compatible with most silicon processing. At the relatively low temperatures usually experienced in CVD, whether thermal or plasma enhanced, quartz remains in a glassy state with a very smooth surface so that it is a very clean material. However, as the feature sizes on integrated circuits has decreased to 0.18 μm and even smaller, quartz support towers have nonetheless experienced substantial problems with producing particles. These particulates fall on the wafer and can significantly reduce the yield of operable integrated circuit dies obtained from the wafer.

Often integrated circuit fabrication is monitored by measuring the number of particles added to a wafer by any step of the fabrication process. It has been found in thermal CVD of silicon nitride that the number of particles generally increases with the number of runs or batches that the quartz tower has processed. As illustrated in FIG. 1, a new tower produces relatively few particles. Thereafter, the number of particles increases with the number of runs, but up to about forty runs the number is acceptable, though still somewhat high. However, after some number of runs, the number of particles greatly increases to a totally unacceptable level. It is believed that the origin of the problem is that the silicon nitride is also depositing on the quartz tower. For 40 runs of depositing 0.15 μm of silicon nitride, a typical nitride layer thickness in an integrated circuit, the nitride build up on the tower may be 6 μm. Silicon nitride has a coefficient of thermal expansion that is significantly different than that of quartz, about $3\times10^{-6}$ versus $0.5\times10^{-6}/°$ C., and the nitride does not bond well with the glassy quartz surface. Differential thermal expansion between the two materials as the tower is cycled between room temperature and the relatively modest thermal CVD temperatures causes the thickly deposited nitride to peel from the quartz and to produce nitride particles, some of which settle on the wafers.

For these reasons, it is typical practice in a production environment to use a tower only for a number of runs somewhat below the experimentally determined point at which the particle count rapidly increases, for example, thirty runs for the data displayed in FIG. 1. It is common practice to then clean the quartz tower in bath of hydrofluoric acid and nitric acid to remove the silicon nitride and to return the cleaned tower to service for another cycle of runs. However, the baseline particle count for a cleaned tower is somewhat higher than that for a new tower, and the number of runs before onset of unacceptable particle count is reduced by about 25%. As a result, quartz towers are typically discarded after only two or three cycles. Although quartz towers are relatively inexpensive, such short life greatly increases the cost of ownership (COO) when measured per wafer. Also, the necessity of changing out towers and cleaning towers complicates the work flow and reduces productivity.

Furthermore, the baseline particle counts for quartz towers are still high, and the onset of greatly increased counts is somewhat variable. Both factors reduce the yield of operable dice obtained from the wafers.

Some of these reasons have prompted the use of silicon carbide towers. Bulk silicon carbide is typically formed by a sintering process, which produces a material containing a high fraction of impurities. For this reason, the sintered material is usually covered with a layer of CVD silicon carbide. As long as the CVD layer is not punctured, contamination is not a problem. The peeling problem is not totally eliminated, but if, after a nitride buildup of about 20 μm on the silicon carbide tower, it is cleaned in aqua regia ($HF/HNO_3$) for up to a week, the tower can be used almost indefinitely. However, the CVD silicon carbide film is fragile, and a single pin hole through the film ruins the coating protect so the tower must be scrapped. Entire towers of CVD silicon carbide can be made, but they are very expensive.

Accordingly, it is greatly desired to provide a support tower that is not subject to such particle problems and can be used for many more runs without cleaning or replacement.

SUMMARY OF THE INVENTION

The invention includes a method of chemical vapor deposition (CVD), particularly thermal CVD, and more particularly deposition of silicon nitride, polysilicon, and related materials, onto multiple wafers supported on a silicon fixture, for example, a tower. Preferably, the silicon fixture is composed of virgin polysilicon. Also, preferably, surfaces of the silicon tower are subjected to surface treatment, such as bead blasting by hard particles, for example, of silicon carbide. The surface treatment may be characterized as introducing sub-surface damage in the silicon part.

The invention also includes such a silicon fixture and its fabrication method. The surface of the fixture has a roughness preferably in the range of 10–100 microinches Ra (0.25–2.5 μm), more preferably 20–75 microinches Ra (0.5–1.9 μm), and most preferably 35–50 microinches Ra (0.9–1.25 μm).

The invention further includes other surface treated silicon parts usable in a CVD reactor or other high-temperature substrate processing reactor.

Silicon tubular members may advantageously be used for liners in CVD reactors and for tubular reactor walls used in high-temperature processing. Such silicon tubular members are conveniently formed by extrusion, whether or not the tube is surface treated.

BRIEF DESCRIPTION OF THE PREFERRED EMBODIMENTS

Figure 1:
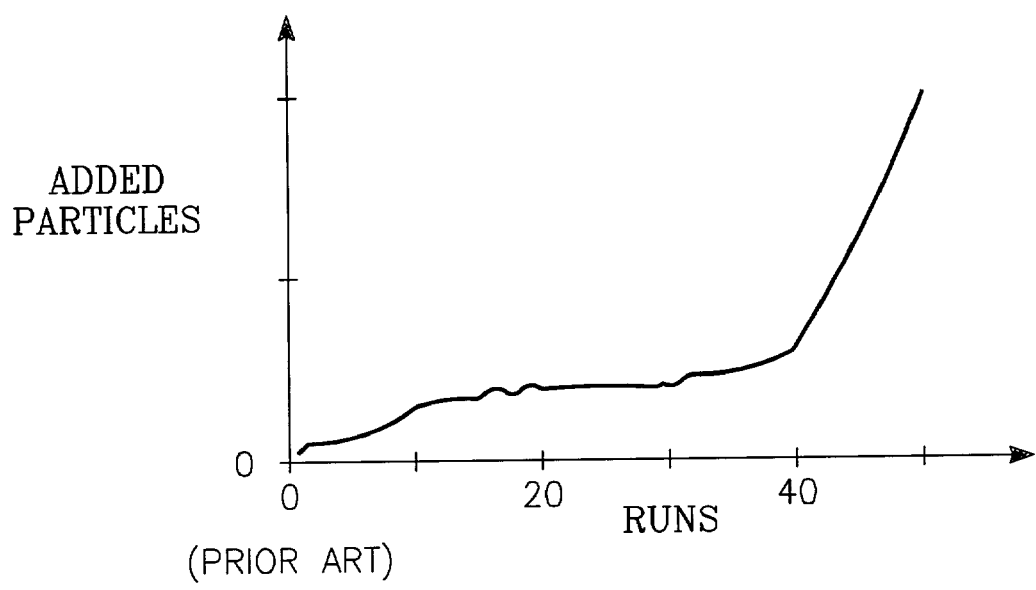
FIG. 1 is a schematic chart showing the generation of particles during batch thermal chemical vapor deposition using a quartz tower of the prior art.
Figure 2:
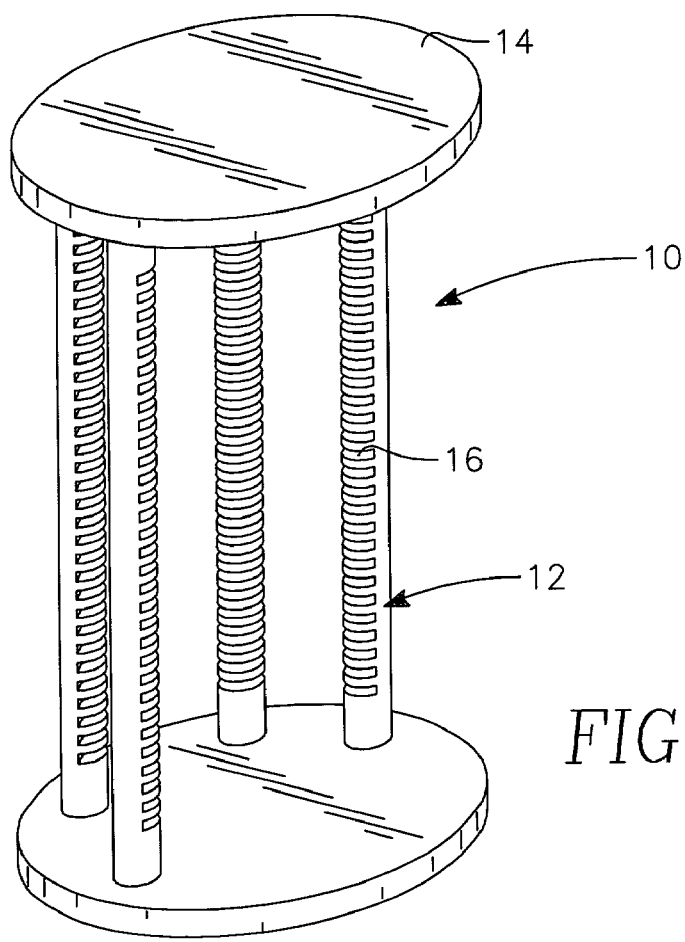
FIG. 2 is an orthographic view of a silicon tower fabricated according to the invention and usable in the processes of the invention.
Figure 3:
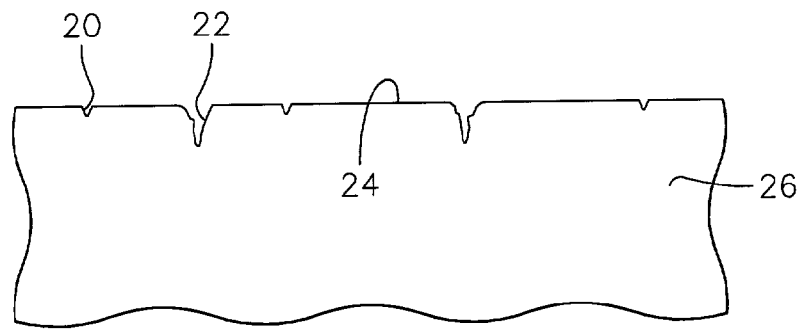
FIG. 3 is a cross-sectional view of a surface of the silicon tower after bead blasting.
Figure 4:
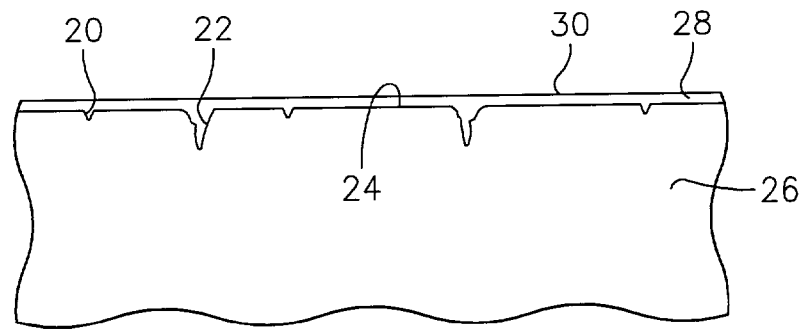
FIG. 4 is a cross-sectional view of the silicon tower surface of FIG. 3 after deposition of a pre-coat layer.
Figure 5:
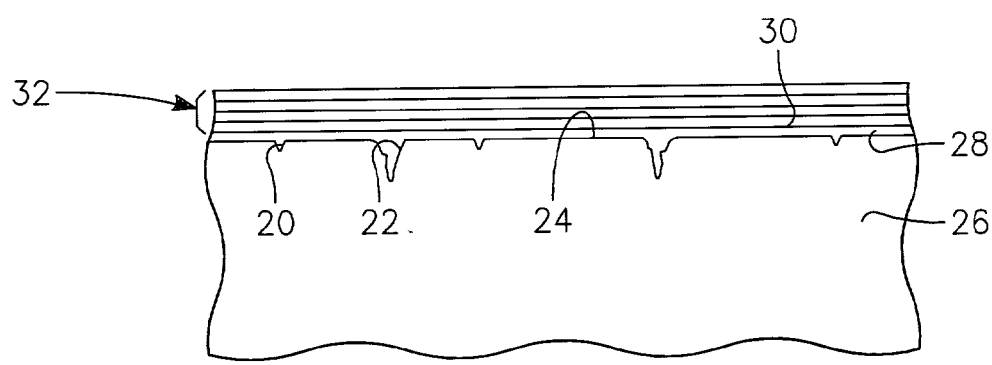
FIG. 5 is a cross-sectional view of the silicon tower surface of FIG. 4 after many runs of depositing silicon nitride.

Silicon fixtures, particularly horizontally extending boats, have been frequently suggested and occasionally used in the past. However, their assembly has presented sufficient problems to prevent the widespread use of silicon towers. Many of these problems with silicon support fixtures have been addressed in a set of patents, U.S. Pat. Nos. 6,196,211, 6,205,993, and 6,225,594 to various of Zehavi, Davis, and Delaney. Boyle et al. in U.S. patent application Ser. No. 09/608,291, filed Jun. 30, 2000, now issued as U.S. Pat. No. 6,455,395 and incorporated herein by reference in its entirety, disclose in detail a method of fabricating one embodiment of such a silicon tower 10, illustrated in FIG. 2. The tower 10 includes multiple silicon legs 12 joined at opposed ends to silicon bases 14. Teeth 16 are cut into the legs 12 to support the wafers.

It is preferred that at least the legs 12 are composed of virgin polysilicon (virgin poly) formed from the chemical vapor deposition of silane or chlorosilane. Such a material is virtually free of contaminants, particularly the rapidly diffusing metals so deleterious to silicon integrated circuits. The bases may be formed of Czochralski (CZ) silicon, preferably polysilicon although monocrystalline may be used, since virgin poly is not typically available in such large diameters. Other forms of silicon such as cast silicon may be used. The process includes joining the legs 12 to the bases 14 with a spin-on glass (SOG) or other glass-like compound followed by high-temperature ambient annealing at preferably between 1025 and 1400° C. to vitrify the SOG and bond it to the already oxidized silicon parts. After assembly, the tower 10, including both the legs 12 and bases 14, is subjected to a surface treatment to introduce controlled sub-surface damage in the silicon.

Such a surface treatment virtually eliminates the particle problem usually associated with thermal CVD of silicon nitride. We believe that the surface treatment not only removes the thick oxide layer formed in the SOG anneal, but also, as illustrated in the cross-sectional view of FIG. 2 produces pits 20 and cracks 22 penetrating into the treated surface 24 of the silicon part 26 of the tower 10. The silicon part 26 may be one of the legs 12 or one of the bases 14.

When the tower enters service, it is preferably first subjected to a pre-treatment similar to a typical nitride CVD deposition in which a silicon nitride pre-coat layer 28 not only covers the part surface 24 but also fills the pits 20 and cracks 22 to produce a smooth pre-coat surface 30. Preferably, during the pre-treatment, no wafers are inserted in the slots to be used in production. The silicon nitride in the pits 20 and cracks 22 firmly anchors the pre-coat layer 28 to the silicon part. Thereafter, when the tower enters normal production, subsequently deposited silicon nitride layers 32 are sequentially deposited over the silicon nitride pre-coat layer 28, which is firmly anchored to the silicon part 26. Although differential thermal expansion continues to exist between the nitride layers 32 and the underlying bulk silicon 26, the force exerted at the interface is insufficient to peel the nitride layers 32 from the part 26.

An effective method of work treating the silicon surface is to roughen it by bead blasting, which is similar to industrial sand blasting. A preferred such method is to blast the surface with particles of silicon carbide of 220 grey grit in a Model 48/PP dry blaster available from Trinity Tool Co. of Fraser, Mich. Particle velocity is controlled by an exit pressure of between about 20 and 80psi. In the bead blasting, the blasting wand is manually swept over all exposed surfaces of the assembled tower. The blasting need not visibly roughen the silicon surface. The silicon surface following the preceding high-temperature SOG anneal has a bluish color, arising from the thick surface oxidation. The blasting is continued until the bluish color turns gray, indicative of silicon with perhaps a very thin native oxide. Preferably, the silicon carbide particles are relatively pure to above 99%, particularly with respect to metals. Use of particles with significant metal contaminants will likely introduce the metal into the silicon part, rendering the treated part much less useful for processing silicon integrated circuits.

Following bead blasting, the treated silicon surface is cleaned by vigorously washing it with a biodegradable, non-phosphate detergent such as Escolex to remove silicon particles clinging to the surface. A final clean with a high-pressure carbon dioxide gun, such as Sno Blo, removes any remaining particles. The final surface roughness has been measured to be typically about 32 microinches (0.8 µm) on the virgin poly legs and 50 microinch (1.3 µm) on the CZ bases. A preferred range of surface roughness, particularly for the legs, is 10 to 100 microinches Ra (0.25 to 2.5 µm Ra) A more preferred range is 20–75 microinches Ra (0.5–1.9 µm Ra), and a most preferred range is 30–50 microinches Ra (0.75–1.25 µm Ra).

It is preferred that no post-treatment etching be performed as this would likely remove the pits and cracks. Post-treatment polishing is also not preferred, except possibly in the wafer bearing surfaces which, in a preferred embodiment, are cut into teeth slanting upwards from the legs at 1 to 3° from the horizontal.

Other hard particles may be used for the blasting, such as ceramics. However, the material must be substantially free of metals known to readily diffuse in silicon and affect its semiconductor qualities. Other types of surface treatment are possible, such as lapping and grinding. However, these processes are dirty, and offer no apparent advantage.

Figure 6:
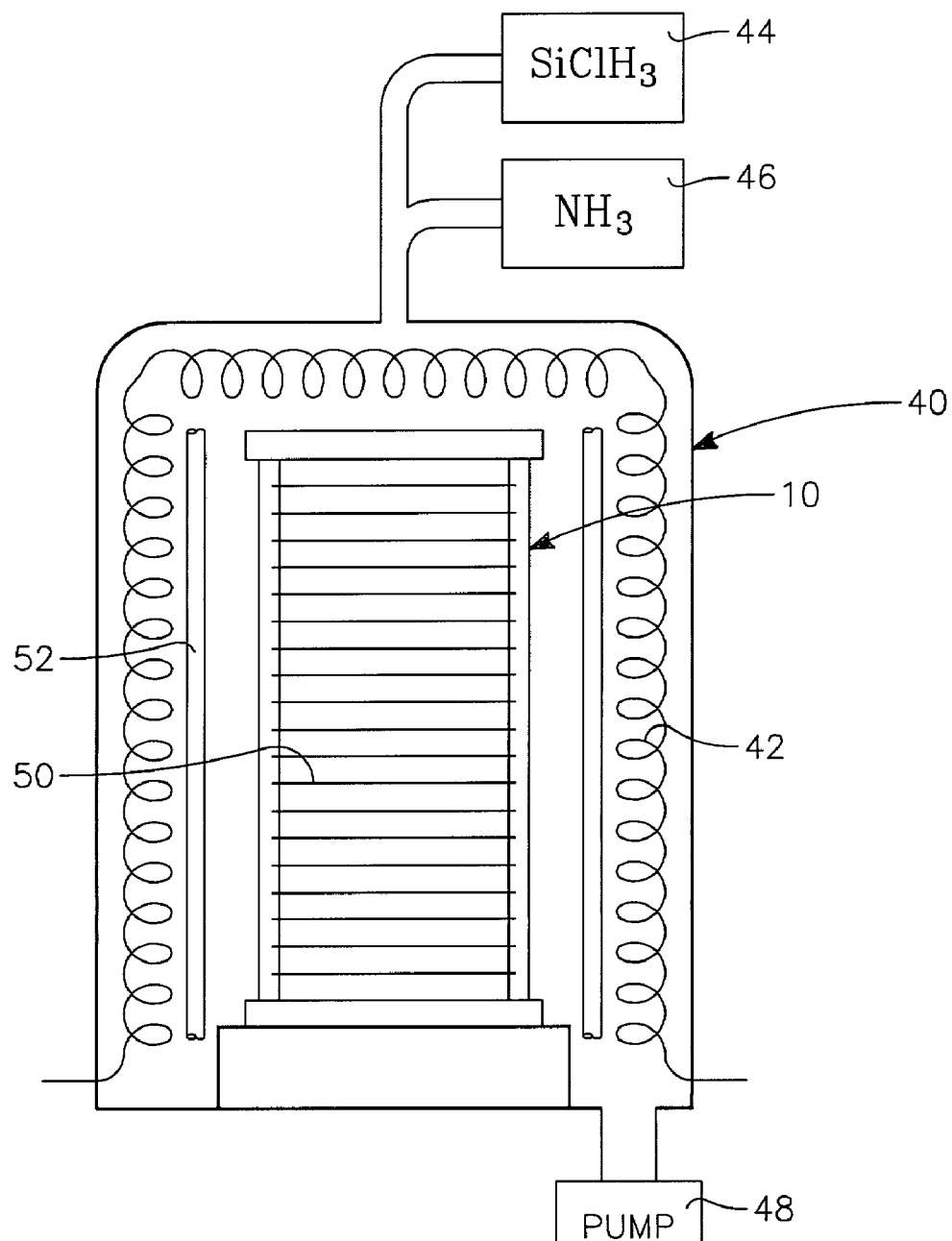
FIG. 6 is a schematic cross-sectional view of a thermal CVD reactor in which a process of the invention may be practiced and in which the tower or shield of the invention may be used.

The silicon tower 10 fabricated according to the above process is used in a batch CVD reactor 40, as illustrated in FIG. 6, which is heated by a resistive coil 42. The reactor is supplied with precursor gases including silane or a chlorosilane such as $SiClH_3$ and ammonia ($NH_3$) from source 44, 46, and a vacuum (exhaust) pump 48 evacuates reactants from the interior of the reactor 40. The pump 48 may maintain the interior of the reactor 40 at anywhere in the range from approximately atmospheric pressure for atmospheric pressure CVD (APCDV) down to about 10 Torr for low pressure CVD (LPCVD). Multiple wafers 50 are loaded into the tower 10 and processed as described above to deposit the silicon nitride in one batch run. When a boat instead of a tower is used, the thermal CVD reactor is typically in the form of a horizontally extending tube, into which the boat bearing multiple wafers is horizontally inserted.

Such surface-treated silicon towers can be used for hundreds to thousands of runs. The nitride build up seems to be limited only by the accumulating nitride filling the slots between the teeth and impeding mechanical clearance of the wafers. Such thicknesses of silicon nitride can be removed by reslotting the teeth or by a long etch in hot hydrofluoric acid.

Polysilicon is also frequently deposited by thermal CVD typically using a silane or chlorosilane precursor gas. A silicon tower for polysilicon CVD deposition is advantageous since the CVD polysilicon is well matched to the virgin poly and possibly other forms of silicon in the tower. A smooth silicon tower surface may suffice for polysilicon deposition. However, it has been observed that CVD polysilicon flakes from IC wafers. Accordingly, the surface treatment of the invention is useful in providing additional bonding between the bulk silicon parts and the deposited polysilicon layers. The silicon tower may be precoated with the same material as that deposited in batch CVD processing of the wafers. That is, for batch deposition of silicon nitride, the precoating may form a silicon nitride layer while, for batch deposition of polysilicon, the precoating may form a polysilicon layer.

Although the invention is particularly useful for support towers and boats supporting multiple wafers, it may also be applied to other parts that are exposed to deposition. For example, a sleeve 52 may be inserted in the CVD reactor 40 of FIG. 6 to control the flow of gases in the reactor. Whatever deposition occurs also coats the interior of the sleeve 52, which may be removed and replaced. In the past, the sleeve 52 has been composed of quartz. A quartz sleeve suffers many of the same problems as a quartz tower. Instead, according to the invention, the sleeve 52 is composed of silicon having a tubularly shaped wall of about 2 to 5 mm thickness. At least its interior walls are surface treated by bead blasting or the like to provide a good anchor for the deposition of many layers of silicon nitride. The lifetime of the treated silicon sleeve 52 is substantially longer than that of a quartz sleeve.

Figure 7:
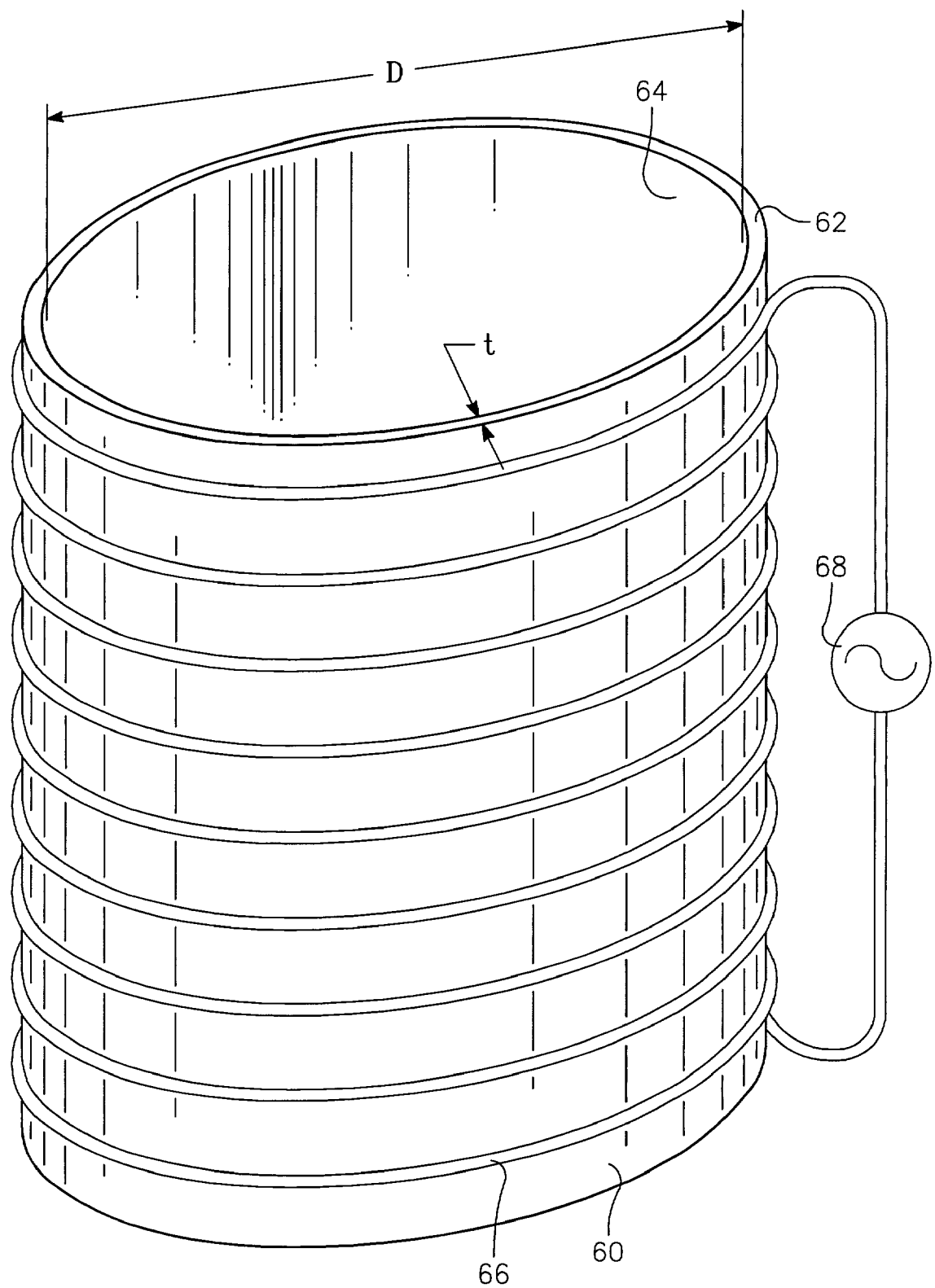
FIG. 7 is a schematic orthographic view of a tubular reactor having silicon sidewalls.

A similarly shaped silicon chamber part is a silicon reactor tube 60 illustrated in the schematic orthographic view of FIG. 7. It has a circularly symmetric wall 62 of thickness t enclosing a bore 64 of diameter D. A resistive heater 66 is wrapped around the tube 60 and is powered by a power supply 68 to heat the interior of the reactor to elevated temperatures. Other forms of heating are possible, such as radiant or RF inductive heating. If the silicon tube 60 has sufficiently high doping so as to be highly conductive, the RF energy may be coupled directly into the tube 60, in which case the power supply 68 supplies RF power rather than AC or DC and the wire 66 may be offset from the tube wall 62.

The diameter D is large enough to accommodate a wafer tower or wafer boat supporting a number of wafers. That is, the diameter D is somewhat larger than the wafer diameter of, for example, 200 or 300 mm. For a tower, the tube is arranged vertically; for a boat, the tube is arranged horizontally and preferably the boat is support on rails cantilevered parallel to the tube wall 62. In either case, the support fixture loaded with wafers is placed in the reactor tube. In a vertically arranged reactor, either the tube is lowered over a stationary tower or the tower may be inserted vertically into a stationary tube. On the other hand, a wafer boat is moved horizontally into a stationary horizontally arranged reactor tube.

The silicon tube 60 is held between unillustrated end caps, preferably formed of surface-treated silicon, providing a support for the tower or boat and ports for the supply gases and exhaust or vacuum pump of FIG. 6. If necessary, the end caps are vacuum sealed to the tube 60 for the relatively modest vacuums required. The thickness of the tube wall 62 is preferably at least 3 mm and more preferably at least 5 mm. Such a reactor tube thereby allows a large portion of the exposed surfaces of the reactor to be composed of high-purity silicon. Such reactor tubes, previously made of quartz or sometimes silicon carbide, are used for thermal CVD of silicon nitride and polysilicon, as previously described, for wet or dry thermal oxidation of silicon, for diffusion doping from an ambient including the doping material, inert annealing including a dopant drive-in, and for other high temperature processes. Advantageously, especially for thermal CVD, the interior surface of the tube wall 64 is surface treated to provide additional adhesion to the deposition material.

Other parts in this or other deposition chambers, such as pedestals, pedestal rings, and rails, typically formed of quartz in the past, may instead be formed of silicon, preferably virgin poly if it is available in adequate sizes, and thereafter surface treated as described above.

Although virgin poly is particularly advantageous for silicon parts which contact the wafer, other chamber parts such as the above described sleeve and wall do not require the very high purity levels associated with virgin poly. The surface treatment described above may be applied to other forms of silicon, for example, float zone (FZ) silicon, CZ silicon, cast silicon, edge film grown (EFG) silicon, the last two of which are prevalently used for solar cells, or other types such as extruded silicon. It is also possible, to perform the described surface treatment on a silicon film deposited on another base material, for example, by CVD.

At the present time, virgin polysilicon is not available in diameters of greater than 200 mm required for the sleeve and reactor tube described above. Silicon of lesser purity is acceptable in many processing applications in which a high-temperature silicon part does not touch the silicon wafer. Nonetheless, the silicon parts should be made of silicon that is substantially pure, for example, has a impurity atomic fraction of metals of less than one part per million and of other components including oxygen, nitrogen, and carbon of substantially less than 1% and preferably less than 50 parts per million. Alternatively, the silicon may be characterized as being semiconductive.

One method of forming the tubular sleeve and wall described above is extrusion of silicon in a tubular shape in a process also called edge film growth (EFG). Some older technology for doctor-blade extrusion of silicon is disclosed by Grabmaier et al. in U.S. Pat. Nos. 4,330,358 and 4,357,201. This technology sinters the extruded form and uses germanium sintering aids, including semiconductor dopants if desired. More recent technology including extruding silicon tubes is disclosed by Stormont et al. in U.S. Pat. No. 4,440,728 and by Harvey et al. in U.S. Pat. No. 5,102,494. GT Equipment Technologies, Inc. of Nashua, N.H. has commercialized and markets technology for extruding large hollow silicon members and sells an extruder under the tradename GIi EFG Puller. It has long been known to form small-diameter sapphire tubes by EFG.

Ten-sided silicon chamber walls have been formed in the past by bonding together ten silicon plates in a closed pattern as one would assemble staves into a barrel. However, this technique has not been successful because the polygonal shape introduces non-uniform flow patterns and the bonding agent used to bond the plates together is a contaminant for semiconductor processing.

The silicon parts of the invention are not limited to batch mode thermal CVD reactors. They can be used for plasma CVD and other low temperature processes performed with wafer temperatures below 400° C. For example, a single-wafer plasma CVD reactor has a side wall and a dome onto which the intended deposition material is likely to also be deposited. In the past, the wall and dome have been typically made of quartz, and a plasma cleaning process has been used to clean the wall and dome surfaces, either between every wafer run or on a less frequent schedule. If the quartz wall, dome, or other part is replaced with a corresponding silicon part surface treated as described above, the plasma cleaning may be eliminated or perhaps delayed until a planned maintenance shutdown. Plasma etching reactors are also subject to deposition of polymeric material and other residues on the chamber walls and parts. The roughened silicon described above will more firmly anchor the residues and reduce the production of particulates.

The invention thus provides a generic approach for reducing particles in substrate processing reactors by the use of surface worked silicon parts. Nonetheless, the silicon material of the parts is readily available at reasonable costs and does not require complex processing.

The invention claimed is:

1. A method of chemical vapor deposition upon a substrate in a chemical vapor deposition reactor configured to sequentially process a plurality of said substrates, comprising the sequential steps of:
   surface treating a silicon part usable in an interior of said chemical vapor deposition reactor so as to introduce a sub-surface damage in said silicon part;
   a first step of forming a pre-coat layer of silicon nitride onto said silicon part while said part is not being used to process any of said substrates; and
   a second step of depositing by chemical vapor deposition a layer of silicon nitride onto said substrate supported in said reactor containing said silicon part and maintained at a temperature of no more than 800° C.

2. The method of claim 1, wherein said silicon part is a portion of a silicon fixture already bonded together and configured to support a plurality of said substrates in said reactor and wherein said depositing step deposits said material onto said plurality of wafers.

3. The method of claim 2, wherein all slots of said fixture intended to support said substrates during production are vacant during said first depositing step.

4. The method of claim 3, wherein said silicon part comprises virgin polysilicon.

5. The method of claim 1, wherein said surface treating comprises bead blasting.

6. The method of claim 5, wherein said bead blasting uses particles of silicon carbide.

7. The method of claim 1, wherein said surface treating produces a surface roughness of at least a portion of said silicon part in a range between 0.25 and 2.5 μm Ra.

8. The method of claim 1, wherein said surface treating includes bead blasting.

9. The method of claim 1, wherein said silicon part comprises virgin polysilicon.

10. The method of claim 1, wherein said surface treating causes said silicon part to have a major surface portion with a surface roughness in a range between 0.25 and 2.5 μm Ra.

11. The method of claim 10, wherein said range extends between 0.5 and 1.9 μm Ra.

12. The method of claim 11, wherein said range extends between 0.75 and 1.25 μm Ra.

13. The method of claim 10, wherein said silicon part is composed of virgin polysilicon.

14. The method of claim 1, wherein said surface treating creates pits and cracks penetrating into a surface of said silicon part and wherein said first depositing step fills said pits and cracks with silicon nitride.

15. The process of claim 1, wherein said second step is performed for at least a plurality of hundreds of runs of normal production of processing substrates for only one performance of said first step, whereby said pre-coat layer prevents flaking of silicon nitride in said second step.

16. The method of claim 1, wherein said first step of forming comprises depositing said pre-coat layer by chemical vapor deposition.

17. A method of chemical vapor deposition in a reactor, comprising the sequentially performed steps of:
   surface treating a support fixture so as to introduce sub-surface damage in silicon support parts of said fixture, wherein said fixture is formed of a plurality of silicon parts bonded together with a bonding agent and includes a plurality of parallel slots configured to support a plurality of wafers on said silicon support parts;

a first step of depositing by chemical vapor deposition a pre-coat layer of a material onto said silicon fixture having said silicon parts already bonded together, all slots of said fixtures intended to support wafers during production being vacant during said first depositing step; and a second step of depositing by chemical vapor deposition a layer of said material onto a plurality of wafers supported in said fixture and maintained at a temperature of no more than 800° C.

18. The method of claim 17, wherein said material comprises silicon nitride.

19. The method of claim 17, wherein said material comprises polysilicon.

20. The method of claim 17, wherein said silicon support parts comprise virgin polysilicon.

21. The process of claim 17, wherein said second step is performed for at least a plurality of hundreds of runs of normal producing of processing substrates following a single performance of said first step, whereby said pre-coat layer prevents flaking in said second step.

22. A method of chemical vapor deposition upon a plurality of substrates in a chemical vapor deposition reactor configured to sequentially process a plurality of said plurality of said substrates, comprising the sequentially performed steps of:

a first step of depositing by chemical vapor deposition a layer of silicon nitride onto a silicon part while said part is not being used to process any of said substrates; and a second step of depositing by chemical vapor deposition a layer of silicon nitride onto said first plurality of substrates supported in said reactor containing said silicon part and maintained at a temperature of no more than 800° C.;

wherein the silicon part is subjected to a surface treating step to create pits and cracks penetrating into a surface of the silicon part prior to the first step.

23. The method of claim 22, wherein said silicon part is a silicon tower supporting said first plurality of substrates in said second step.

24. The method of claim 23, wherein said silicon tower comprises two bases and a plurality of substrate-support legs, said bases and legs having been bonded together into said silicon tower prior to said first step.

25. The method of claim 23, wherein said silicon tower comprises virgin polysilicon.

26. The method of claim 23, wherein said silicon tower is bonded together prior to said first step.

27. The method of claim 22, wherein said second step is performed at least within a plurality of hundreds of runs of normal production of processing substrates for a single performance of said first step.

28. The method of claim 22, wherein said part prior to said first step is structurally capable of being used in said second step.

* * * * *